United States Patent
Van Riesen et al.

(10) Patent No.: US 7,932,462 B2
(45) Date of Patent: Apr. 26, 2011

(54) ARRANGEMENT COMPRISING A SOLAR CELL AND AN INTEGRATED BYPASS DIODE

(75) Inventors: Sascha Van Riesen, Freiburg (DE); Rüdiger Löckenhoff, Freiburg (DE); Gerhard Strobl, Stuttgart (DE); Ron Dietrich, Heilbronn (DE); Wolfgang Koestler, Heilbronn (DE)

(73) Assignees: Fraunhofer-Gesellschaft zur Förderung der angewandten e.V., München (DE); Albert-Ludwigs-Universtät, Freiburg (DE); AZUR SPACE Solar Power GmbH, Heilbronn (DE)

( * ) Notice: Subject to any disclaimer, the term of this patent is extended or adjusted under 35 U.S.C. 154(b) by 184 days.

(21) Appl. No.: 11/667,755

(22) PCT Filed: Nov. 3, 2005

(86) PCT No.: PCT/DE2005/001985
§ 371 (c)(1), (2), (4) Date: Aug. 3, 2007

(87) PCT Pub. No.: WO2006/053518
PCT Pub. Date: May 26, 2006

(65) Prior Publication Data
US 2008/0128014 A1 Jun. 5, 2008

(30) Foreign Application Priority Data
Nov. 16, 2004 (DE) .......................... 10 2004 055 225

(51) Int. Cl.
*H01L 31/042* (2006.01)

(52) U.S. Cl. ........................................ 136/249; 136/243
(58) Field of Classification Search .................. None
See application file for complete search history.

(56) References Cited

U.S. PATENT DOCUMENTS

| 5,990,415 | A | 11/1999 | Green et al. |
| 6,452,086 | B1 | 9/2002 | Muller |
| 6,600,100 | B2 | 7/2003 | Ho et al. |
| 2002/0179141 | A1 | 12/2002 | Ho et al. |
| 2003/0140962 | A1 | 7/2003 | Sharps et al. |
| 2004/0163698 | A1 | 8/2004 | Sharps et al. |

FOREIGN PATENT DOCUMENTS

| EP | 1 094 521 A2 | 4/2001 |
| EP | 1 094 521 A3 | 5/2004 |

OTHER PUBLICATIONS

Sascha Van Riesen et al: "GaAs-Monolithically Interconnected Modules (MIMS) With An Efficiency Above 20%"; 19th European Photovoltaic Solar Energy Conference, Jun. 7-11, 2004; Paris, France.

*Primary Examiner* — Alexa D Neckel
*Assistant Examiner* — Miriam Berdichevsky
(74) *Attorney, Agent, or Firm* — Breiner & Breiner, LLC

(57) ABSTRACT

The present invention relates to an arrangement having at least one solar cell, which is formed by a first sequence of differently doped layers (1, 2, 11, 12) on a substrate (6, 16), and at least one bypass diode, which is connected to the solar cell, particularly in a monolithic, series-connected solar module. The arrangement is characterized in that the bypass diode is formed by a second sequence of layers (4, 5, 13, 14), which is arranged between the substrate (6, 16) and the first layer sequence (1, 2, 11, 12).
With the proposed arrangement monolithic, series-connected solar modules can be formed at a very low loss of active receiving surface, the solar cells of which are protected by bypass diodes.

12 Claims, 2 Drawing Sheets

ARRANGEMENT COMPRISING A SOLAR CELL AND AN INTEGRATED BYPASS DIODE

TECHNICAL FIELD

The present invention relates to an arrangement having at least one solar cell, which is formed by a first sequence of layers on a substrate, and at least one bypass diode, which is connected to the solar cell, particularly in a monolithic, series-connected solar module.

BACKGROUND OF THE INVENTION

Solar cells are often used in the form of solar modules, in which they are arranged in rows and columns. Sufficient voltage for the consumer is generated by connecting the solar cells in series in the solar module. However, if part of the solar module is in shadow, there is a risk that the shadowed cells may be destroyed due to the serial connection, because in this case they function as electrical consumers. The individual solar cells in the solar module should therefore be protected from overvoltages in the reverse direction by bypass diodes.

However, it is not possible to connect the individual solar cells to bypass diodes in monolithically interconnected modules (MIM) in an unlimited manner. Monolithic, series-connected solar modules include a great number of solar cells which are applied as a layer sequence to a common, semi-insulating substrate. The individual solar cells are separated from each other by trenches in the layer sequence and connected to each other via integrated metal contacts. One example of an MIM solar module and a method for producing such a module is described for example in the publication by S. van Riesen et al., "GaAs-Monolithically Interconnected Modules (MIMS) with an Efficiency above 20%", 19$^{th}$ European Photovoltaic Solar Energy Conference, 7-11 Jun. 2004, Paris. The individual photovoltaically active surfaces of the solar cells of such a solar module are normally very narrow, having a width of about 1 mm to limit the current strength in strong light. They are therefore highly suitable for use in concentrator systems, for example parabolic mirror and shape concentrators. Until now however, when single cells in monolithically series-connected solar modules were connected to bypass diodes, it was necessary to sacrifice a significant amount of active receiving surface in order to integrate the bypass diodes in the solar module between the solar cells. The performance capability of the diodes in such an arrangement was also limited.

Even the species-related U.S. Pat. No. 6,600,100 B2 or US 2004/0163698 A1 only describe arrangements in which the bypass diodes are located either on or beside the photovoltaically active layers.

The object of the present invention is to suggest an arrangement of a solar cell having a bypass diode that enables improved performance capability of the bypass diode and results in reduced loss of active receiving surface when it is integrated in a solar module.

BRIEF DESCRIPTION OF THE INVENTION

The object is solved with the arrangement of solar cell and bypass diode as recited in claim 1. Advantageous embodiments of the arrangement are the object of the subordinate claims or may be deduced from the following description and the embodiments.

The present arrangement with a solar cell that is formed in known manner by a first layer sequence of differently doped layers on a substrate and a bypass diode that is connected to the solar cell, is characterised in that the bypass diode is formed by a second layer sequence, which is arranged between the substrate and the first layer sequence. In this context, the first layer sequence represents the photovoltaically active layer sequence of the solar cell.

In the present connection of solar cell to the bypass diode, the bypass diode is thus integrated in the construction of the solar cell that includes the substrate and the first layer sequence. The bypass diode is made up of a layer sequence of one n-conducting and one p-conducting layer, which cover the entire area between the photovoltaically active layer sequence of the solar cell and the substrate. Consequently, no additional area is required for the bypass diode itself beside the photovoltaically active surface, i.e. the active receiving surface of the solar cell. Only the area required for contacting the bypass diode entails a slight additional loss of less than 5% of the active receiving surface. Yet all solar cells in a solar module of such kind, preferably a MIM module, are protected by the bypass diodes. The full-coverage design of the bypass diode also improves the performance capability of this component.

In an advantageous refinement of the present arrangement, a thin, richly doped layer sequence forming a tunnel diode is located between the photovoltaically active layer sequence of the solar cell and the layer sequence forming the bypass diode. This tunnel diode enables a simpler construction of the arrangement.

The first layer sequence preferably includes at least one p-conducting and one n-conducting layer, which form the photovoltaically active surface, and are located on a richly doped lateral conduction layer (LCL). Additional reflective and/or passivating layers may also be provided. A layer sequence of such kind for forming a solar cell is known from the related art, for example from the publication by S. van Riesen cited in the introduction to this description.

In a preferred embodiment, the present arrangement is a component of a monolithically series-connected solar module (MIM), in which a plurality of solar cells, each with an integrated bypass diode, are arranged side-by-side and connected to each other in series. In this context, the individual layers are first applied preferably over the entire surface of a common substrate in an epitaxy process, preferably MOVPE (Metal Organic Vapor Phase Epitaxy). In this process the second layer sequence that forms the bypass diodes is arranged between the first layer sequence for forming the solar cells and the substrate. After the layer sequences have been applied, low lying semiconductor layers are exposed to enable electrical contact by etching trenches, and the individual solar cells in the solar module are isolated from each other by these trenches, which extend into the substrate. Where such is necessary or advantageous, the walls of the trenches that are etched are covered with an insulator. Adjacent solar cells are then connected in series by the application of a structured metal layer that connects different semiconductor layers electrically inside and outside of the trenches. With this electrical contacting, the bypass diodes are integrated in the connection.

In an advantageous configuration of the present arrangement, a layer construction is selected in which a richly doped n-conducting lateral conduction layer, a thin layer sequence forming a tunnel diode, a p-doped layer and a richly doped n-conducting lateral conduction layer forming the bypass diode, a thin layer sequence forming another tunnel diode, and a p-doped layer and an n-doped layer forming the photovoltaically active layer sequence are applied to the substrate in the order indicated.

Moreover, additional reflective and/or passivating layers may also be provided at an appropriate point in the layer structure. In this structure, metal contacting only has to be provided for n-doped layers in order to connect adjacent solar cells in series and include the bypass diodes, so that this is possible with a uniform, structured metal layer. Accordingly, such an arrangement entails less production effort than a configuration in which contacting must be assured for both n-doped and p-doped semiconductor layers, for which different metal layers are necessary.

BRIEF DESCRIPTION OF THE DRAWING

In the following, the present arrangement will be explained in greater detail on the basis of embodiments thereof and with reference to the drawings, without limiting the scope of protection as specified in the claims. In the drawings:

MODE OF IMPLEMENTATION OF THE INVENTION

Figure 1:
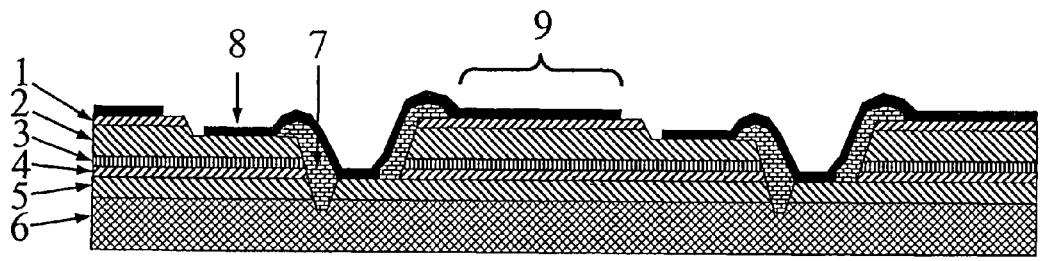
FIG. 1 is a cross section through a first example of a structure of the present arrangement in a solar module.

FIG. 1 shows an example of a structure of the present arrangement in a monolithic, series-connected solar module (MIM). The figure shows a cutout in the solar module, in which 3 series-connected solar cells with bypass diodes are at least partly shown. The figure shows a cross section through the layer structure and the connection of adjacent solar cells. In the present embodiment, the layer structure is made up of the following semiconductor layers:

A layer sequence 4, 5 of oppositely doped semiconductor layers forming the bypass diode is applied to semi-insulating substrate 6, which is a GaAs wafer. Layer 4, made from GaAs and having p-doping of about $2*10^{18}$ cm$^{-3}$ and a thickness of about 50 nm represents the bypass diode's emitter. n-doped layer 5, which is also made from GaAs, includes a 50 nm thick sublayer with doping of about $2*10^{18}$ cm$^{-3}$ as the base of the bypass diode, and a 500 nm thick sublayer with doping of about $5*10^{18}$ cm$^{-3}$, which forms a lateral conduction layer of the bypass diode.

A further, thin semiconductor layer 3 of GaAs is applied on this layer sequence 4, 5 to form a tunnel diode. This layer is made up of a lower, p-doped sublayer (20 nm; $p=10^{19}$ cm$^{-3}$) as the base, and an upper, n-doped sublayer (20 nm; $n=10^{19}$ cm$^{-3}$) as the tunnel diode's emitter.

Finally, a layer sequence 1, 2 made up of two oppositely doped semiconductor layers is applied to layer 3 that forms the tunnel diode. Upper layer 1 consists of an approximately 1000 nm thick p-doped layer of GaAs with a doping of about $2*10^{18}$ cm$^{-3}$ as the solar cell's emitter, to which a 20 nm thick passivating layer of AlGaAS is applied as a window layer that reflects minority charge carriers. n-doped layer 2 consists of three sublayers, of which the uppermost, a 2000 nm thick sublayer of GaAs with a doping of approximately $5*10^{17}$ cm$^{-3}$, forms the base of the solar cell. Underneath this is a 50 nm thick passivating layer of AlGaAs with a doping of approximately $5*10^{18}$ cm$^{-3}$. The bottom sublayer is made from GaAS has a rich doping of about $5*10^{18}$ cm$^{-3}$ and high thickness of 2000 nm and forms a highly conductive lateral conduction layer with low layer resistance.

In order to separate the individual solar cells within the solar module and to provide electrical series connection, trenches are created in the epitactically grown layer structure, and some of these extend into the substrate. These trenches assure insulation between the individual solar cells in the solar module. They also serve to allow electrical contacting between the semiconductor layers at various depths. In this context, the side walls of the trenches are initially covered with an insulating layer 7 of polyimide, for example. This insulating material is applied in structured form in a known manner using suitable photolithography and/or etching procedures. The same applies for metal layer 8, which provides an electrical connection for the series-connected adjacent solar cells, and also a parallel connection between the respective bypass diode and the solar cell. It is made from conventional thin metal contacts used to produce ohmic metal-semiconductor junctions and a highly conductive, 2 μm thick layer of silver above them. The metalizing extends over the photovoltaically active surface of the respective solar cell in the form of contact grid 9 with fine contact fingers.

Figure 2:
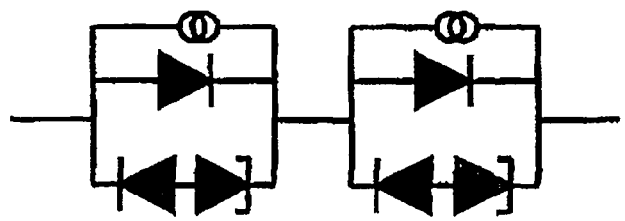
FIG. 2 is an equivalent circuit diagram for the structure illustrated in FIG. 1.

FIG. 2 shows an equivalent circuit diagram for the connection between the individual solar cells and the bypass diodes as shown in FIG. 1. In this equivalent circuit diagram, the solar cells are represented in known manner by a current source and a diode that is parallel thereto, the bypass diode and the tunnel diode being connected to the solar cell in parallel. It may be seen from this equivalent circuit diagram that the voltage that is present in the reverse direction across the solar cell when the solar cell is in shadow is dissipated via the bypass diode.

Figure 3:
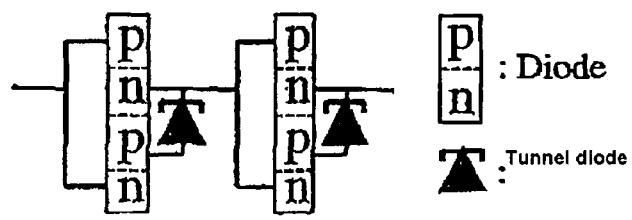
FIG. 3 is a modified circuit diagram for the structure illustrated in FIG. 1.

Finally, FIG. 3 shows a modified equivalent circuit diagram, which also reflects the layer structures of both the solar cell and the bypass diode.

The layer structure of the arrangement of FIG. 1 in a solar module differs from known solar modules without an integrated bypass diode in that it has an additional layer sequence of semiconductor layers 4, 5 that form the bypass diode, and layer 3 forming the tunnel diode, and the additional metal contacting of semiconductor layer 5, which forms a part of the bypass diode. With the layer structure as shown in FIG. 1, it is necessary to ensure contact between differently doped semiconductor layers, i.e., both n-doped and p-doped layers. Various metal layers are required for this, which increases the effort involved in production. This added production effort may be avoided by integrating a further tunnel diode, as will be shown in the following figures.

Figure 4:
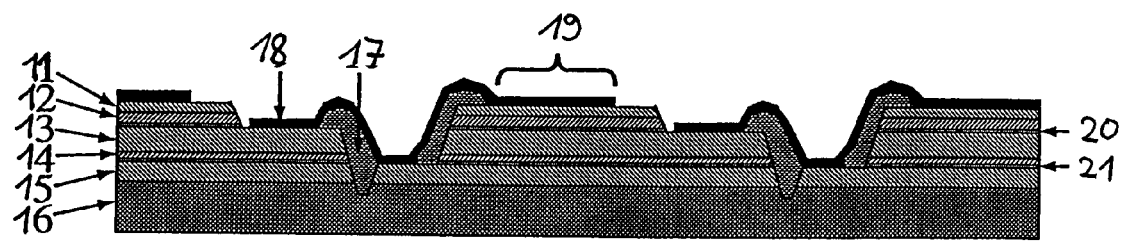
FIG. 4 is a cross section through a second example of a structure of the present arrangement in a solar module.

FIG. 4 shows an example of a modified structure of the arrangement with a solar cell and a bypass diode within an MIM solar module. In this example, the epitactically grown layer structure consists of the following semiconductor layers:

A richly n-doped lateral conduction layer 15 (LCL) is located above semi-insulating substrate 16. A thin layer sequence 21 is applied to this layer to form a tunnel diode. A layer sequence consisting of a p-doped layer 14 and a richly doped n-conducting lateral conduction layer 13 is located above layer sequence 21 which forms the tunnel diode, and the bypass diode is formed by the pn-junction thereof. This is followed by a further thin layer sequence 20 forming a tunnel diode, on which a p-doped semiconductor layer 12 is located as the base of the solar cell. Finally, this is followed by n-doped semiconductor layer 11, which forms the solar cell's emitter. The formation of the trenches, insulation of the trench side walls with an insulating layer 17, and electrical connection of the individual solar cells with the bypass diodes in this structure by metal layer 18, which passes into a contact finger structure 19 across the photovoltaically active surface, are effected in the same way as in the embodiment of FIGS. 1-3.

With the layer construction of FIG. 4, only semiconductor layers of the same doping (in this case, n-doped) have to be contacted with metal contact layer 18. This reduces production effort, but necessitates the introduction of an additional tunnel diode.

Figure 5:
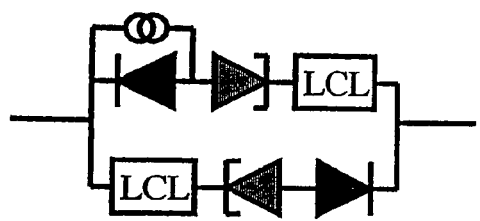
FIG. 5 is an equivalent circuit diagram for the structure illustrated in FIG. 4.
Figure 6:
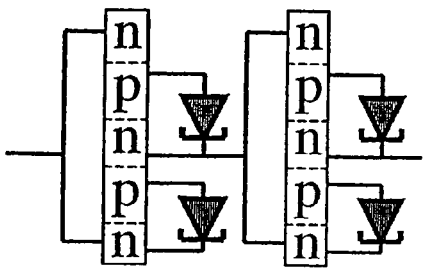
FIG. 6 is a modified circuit diagram for the structure illustrated in FIG. 4.

FIG. 5 shows an equivalent circuit diagram of this layer construction, in which the solar cell, both tunnel diodes and the bypass diode are illustrated. As with FIG. 3, FIG. 6 further shows a modified equivalent circuit diagram of this layer structure also reflecting the layer structure. These equivalent circuit diagrams also show that the bypass diode protects the individual solar cells in the event of overvoltage in the reverse direction.

It is also immediately evident from FIGS. 1 to 4 that the selected integration of the bypass diode in the layer structure of the individual solar cells only entails a minor loss of active receiving surface. Thus, by implementing the present arrangement in a monolithic, series-connected solar module it is possible to produce large-surface receivers in which each individual solar cell is protected by the bypass diodes.

LEGEND 1 p-doped semiconductor layer as the solar cell's emitter
2 n-doped semiconductor layer as the solar cell's base
3 Layer sequence forming tunnel diode
4 p-doped semiconductor layer as the bypass diode's emitter
5 n-doped semiconductor layer as the bypass diode's base
6 Semi-insulating substrate
7 Insulation layer
8 Metal layer
9 Contact grid
11 n-doped semiconductor layer as the solar cell's emitter
12 p-doped semiconductor layer as the solar cell's base
13 n-doped semiconductor layer
14 p-doped semiconductor layer
15 n-doped lateral conduction layer
16 Semi-insulating substrate
17 Insulation layer
18 Metal layer
19 Contact grid
20 Layer sequence forming the tunnel diode
21 Layer sequence forming the tunnel diode

The invention claimed is:

1. Arrangement comprising at least one solar cell in a plurality of series-connected solar cells arranged side by side in one plane on a substrate, said at least one solar cell including a first sequence of layers on a substrate, wherein said layers are differently doped layers; and at least one bypass diode, wherein said bypass diode is connected to the at least one solar cell and is formed by a second sequence of one n-conducting layer and one p-conducting layer, which cover an entire area between a photovoltaically active layer sequence of the solar cell and the substrate, and wherein the bypass diode is arranged between the substrate and the first sequence of layers.

2. The arrangement as claimed in claim 1, wherein a plurality of said at least one solar cell are connected via a metal layer to form the plurality of series-connected solar cells arranged side by side in one plane on a substrate, said metal layer extending over a photovoltaically active area of the plurality of said at least one solar cell in a form of a contact grid with contact fingers.

3. The arrangement as claimed in claim 2, further comprising trenches to provide electrical contact with layers at lower levels towards said substrate in said arrangement.

4. The arrangement as claimed in claim 3, wherein the first sequence of layers includes at least one p-conducting layer and at least one n-conducting layer, which form the photovoltaically active area and are located on a doped lateral conduction layer having low layer resistance.

5. The arrangement as claimed in claim 4, wherein said bypass diode is a rectifying bypass diode.

6. The arrangement as claimed in claim 5, wherein at least one third sequence of layers is located between the first sequence of layers and the second sequence of layers, and forms a tunnel diode.

7. The arrangement as claimed in claim 1, wherein the substrate has applied thereto at least layers or layer sequences in an order as follows:
 a first doped n-conducting lateral conduction layer;
 a layer sequence forming a first tunnel diode;
 a p-doped layer and a second doped n-conducting lateral conduction layer as the second sequence;
 a layer sequence forming a second tunnel diode; and
 a p-doped layer and an n-doped layer as the first sequence of layers.

8. A solar module comprising a plurality of solar cells arranged side-by-side and connected to each other in series, and which are connected to said at least one bypass diode in the arrangement as claimed in claim 7.

9. The arrangement as claimed in claim 1, further comprising at least one third sequence of layers located between the first sequence of layers and the second sequence of layers, and forms a tunnel diode.

10. The arrangement as claimed in claim 9, wherein a plurality of said at least one solar cell are connected via a metal layer to form the plurality of series-connected solar cells arranged side by side in one plane on a substrate, said metal layer extending over a photovoltaically active area of the plurality of said at least one solar cell in a form of a contact grid with contact fingers.

11. The arrangement as claimed in claim 10, further comprising trenches to provide electrical contact with layers at lower levels toward said substrate in said arrangement.

12. The arrangement as claimed in claim 1, wherein said bypass diode is a rectifying bypass diode.

* * * * *